(12) United States Patent
Chen

(10) Patent No.: US 10,770,973 B1
(45) Date of Patent: Sep. 8, 2020

(54) FAST TRANSIENT CURRENT MODE CONTROL CIRCUIT AND METHOD

(71) Applicant: ANPEC ELECTRONICS CORPORATION, Hsinchu (TW)

(72) Inventor: Fu-Chuan Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/535,891

(22) Filed: Aug. 8, 2019

(30) Foreign Application Priority Data

May 10, 2019 (TW) .............................. 108116289 A

(51) Int. Cl.
| | |
|---|---|
| *H02M 3/158* | (2006.01) |
| *H02M 3/157* | (2006.01) |
| *G05F 1/565* | (2006.01) |
| *H02M 1/08* | (2006.01) |
| *H03K 19/20* | (2006.01) |
| *H02M 1/00* | (2006.01) |

(52) U.S. Cl.
CPC ............. *H02M 3/158* (2013.01); *H02M 1/08* (2013.01); *H02M 3/157* (2013.01); *G05F 1/565* (2013.01); *H02M 2001/0009* (2013.01); *H03K 19/20* (2013.01)

(58) Field of Classification Search
CPC ........ G05F 1/565; H02M 3/157; H02M 3/158
USPC .......................................... 323/277, 283–286
See application file for complete search history.

(56) References Cited

U.S. PATENT DOCUMENTS

| | | | | |
|---|---|---|---|---|
| 9,041,376 | B2* | 5/2015 | Weng | H02M 1/36 323/283 |
| 9,966,849 | B1* | 5/2018 | Lin | H02M 3/158 |
| 2013/0293211 | A1* | 11/2013 | Chen | H02M 3/1588 323/282 |
| 2014/0097811 | A1* | 4/2014 | Yang | G05F 1/468 323/271 |
| 2014/0312862 | A1* | 10/2014 | Xie | H02M 3/156 323/271 |
| 2015/0008895 | A1* | 1/2015 | Weng | H02M 3/156 323/285 |
| 2015/0028830 | A1* | 1/2015 | Chen | H02M 3/158 323/271 |
| 2015/0188425 | A1* | 7/2015 | Chang | H02M 3/158 323/271 |
| 2017/0315578 | A1* | 11/2017 | Lin | G05F 3/262 |

* cited by examiner

*Primary Examiner* — Gary A Nash
(74) *Attorney, Agent, or Firm* — Li & Cai Intellectual Property (USA) Office

(57) ABSTRACT

A fast transient current mode control circuit and a method thereof are provided. The circuit includes a slope detector circuit and a switch controller circuit. The slope detector circuit detects an output voltage signal of a power convertor. When a voltage of the output voltage signal drops sharply and a slope of the output voltage signal is larger than a slope threshold, the slope detector circuit outputs a transient enhanced signal. The switch controller circuit outputs a switch control signal to an upper bridge switch of the power convertor according to the transient enhanced signal to turn on the upper bridge switch during a duty cycle of a pulse wave of the transient enhanced signal, such that a current flowing through an inductor of the power convertor increases to be equal to a current flowing through a load of a system.

10 Claims, 12 Drawing Sheets

FAST TRANSIENT CURRENT MODE CONTROL CIRCUIT AND METHOD

CROSS-REFERENCE TO RELATED PATENT APPLICATION

This application claims the benefit of priority to Taiwan Patent Application No. 108116289, filed on May 10, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a transient current mode control circuit, and more particularly to a fast transient current mode control circuit and a method thereof.

BACKGROUND OF THE DISCLOSURE

A power system may include a power converter for supplying power to a load. In detail, the power converter is configured to convert one form of electric energy into another form of electric energy to be supplied to the load of a system connected to an output terminal of the power converter.

SUMMARY OF THE DISCLOSURE

In response to the above-referenced technical inadequacies, the present disclosure provides a fast transient current mode control circuit, which is applicable for a power converter. The power converter includes an upper bridge switch, a lower bridge switch, a storage inductor and a first capacitor. The upper bridge switch is connected to the lower bridge switch. One terminal of the storage inductor is connected to a node between the upper bridge switch and the lower bridge switch. The other terminal of the storage inductor is grounded through the first capacitor. The fast transient current mode control circuit includes a slope detector circuit and a switch controller circuit. The slope detector circuit is connected to or contacted with an output terminal of the power converter between the storage inductor and the first capacitor. The slope detector circuit is configured to detect an output voltage signal from the output terminal of the power converter between the storage inductor and the first capacitor. When an output voltage of the output voltage signal drops sharply and a slope of the output voltage signal is larger than a slope threshold, the slope detector circuit is configured to output a transient enhanced signal having a pulse wave. A rising edge of the pulse wave is aligned with a starting point from which the output voltage signal drops sharply. A falling edge of the pulse wave is aligned with a transition point from which the output voltage signal stops falling and begins to rise. The switch controller circuit is connected to the slope detector circuit and the upper bridge switch. The switch controller circuit is configured to output a switch control signal to the upper bridge switch to turn on the upper bridge switch during a duty cycle of the pulse wave according to the transient enhanced signal, such that an inductor current flowing through the storage inductor increases to be equal to a load current flowing through a load of a system connected to the output terminal of the power converter.

In one aspect, the present disclosure provides a fast transient current mode control method, which is applicable for a power converter. The power converter includes an upper bridge switch, a lower bridge switch, a storage inductor and a first capacitor. The upper bridge switch is connected to the lower bridge switch. One terminal of the storage inductor is connected to a node between the upper bridge switch and the lower bridge switch. The other terminal of the storage inductor is grounded through the first capacitor. The fast transient current mode control method includes the following steps: detecting an output voltage signal from the output terminal of the power converter between the storage inductor and the first capacitor by a slope detector circuit; determining whether or not an output voltage of the output voltage signal drops sharply and a slope of the output voltage signal is larger than a slope threshold by the slope detector circuit; in response to determining that the output voltage of the output voltage signal does not drop sharply or the slope of the output voltage signal is not larger than the slope threshold, returning to the previous step; in response to determining that the output voltage of the output voltage signal drops sharply and the slope of the output voltage signal is larger than the slope threshold, outputting a transient enhanced signal having a pulse wave by the slope detector circuit, a rising edge of the pulse wave being aligned with a starting point from which the output voltage signal drops sharply, and a falling edge of the pulse wave being aligned with a transition point from which the output voltage signal stops falling and turns to rise; and outputting a switch control signal to the upper bridge switch to turn on the upper bridge switch during a duty cycle of the pulse wave according to the transient enhanced signal by a switch controller circuit, such that an inductor current flowing through the storage inductor increases to be equal to a load current flowing through a load of a system connected to the output terminal of the power converter.

As described above, the present disclosure provides the fast transient current mode control circuit and method, which use the switch controller circuit to turn on the upper bridge switch when the slope detector circuit SPDET detects that the slope of the output voltage of the power converter or the feedback voltage that is divided from the output voltage is larger than the slope threshold. As a result, during pumping of the load of the system at the output terminal of the power converter, the inductor current of the storage inductor can quickly increase to be equal to the current flowing through the load of the system and the voltage of the error amplified signal output by the error amplifier can quickly increase to be equal to the target voltage. Therefore, the power converter can have improved operational efficiency and drops much less electrical power.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
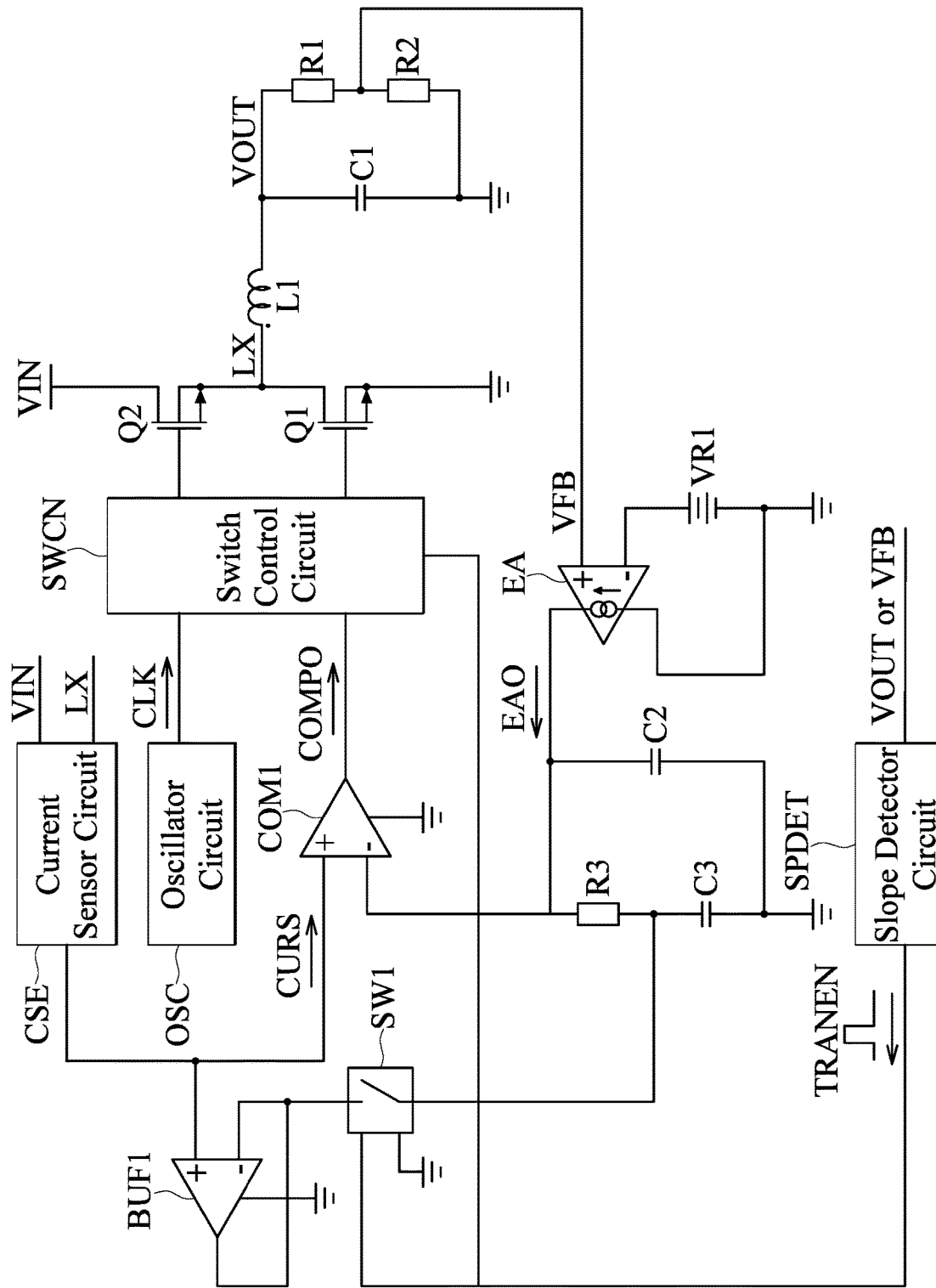
FIG. 1 is a circuit layout diagram of a fast transient current mode control circuit according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 6:
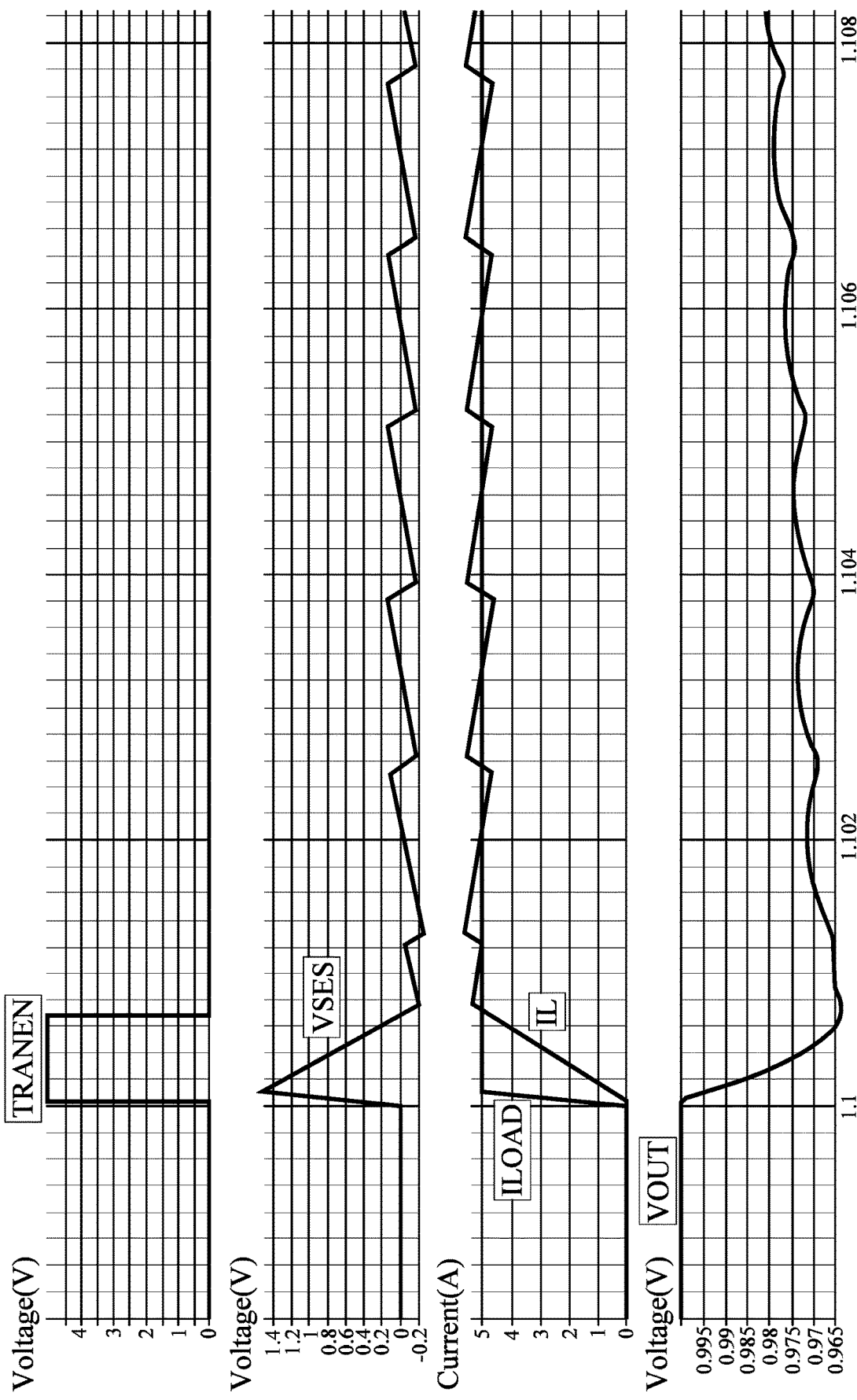
FIG. 6 is a waveform diagram of a transient enhanced signal, a voltage slope detected signal, a load current signal, an inductor current signal and an output voltage signal of the fast transient current mode control circuit and method according to the embodiment of the present disclosure.

Reference is made to FIGS. 1 and 6, wherein FIG. 1 is a circuit layout diagram of a fast transient current mode control circuit according to an embodiment of the present disclosure, and FIG. 6 is a waveform diagram of a transient enhanced signal, a voltage slope detected signal, a load current signal, an inductor current signal and an output voltage signal of the fast transient current mode control circuit and method according to the embodiment of the present disclosure.

As shown in FIG. 1, in the embodiment, the fast transient current mode control circuit includes a slope detector circuit SPDET, a switch controller circuit SWCN, a current sensor circuit CSE, an oscillator circuit OSC and a buffer circuit, and is applicable for a power converter. The buffer circuit includes a buffer BUF1 and a switching switch SW1.

The power converter may include an upper bridge switch Q2, a lower bridge switch Q1, a storage inductor L1 and a first capacitor C1. A first terminal such as a drain terminal of the upper bridge switch Q2 is connected to an input voltage source VIN. A second terminal such as a source terminal of the upper bridge switch Q2 is connected to a first terminal such as a drain terminal of the lower bridge switch Q1. A second terminal such as a source terminal of the lower bridge switch Q1 is grounded. One terminal of the storage inductor L1 is connected to a node LX between the second terminal of the upper bridge switch Q2 and the first terminal of the lower bridge switch Q1. The other terminal of the storage inductor L1 is grounded through the first capacitor C1.

The slope detector circuit SPDET is connected to or contacted with a node between the storage inductor L1 and the first capacitor C1. That is, the slope detector circuit SPDET is connected to or contacted with an output terminal of the power converter. The slope detector circuit SPDET is configured to detect an output voltage signal VOUT from the output terminal of the power converter between the storage inductor L1 and the first capacitor C1. As shown in FIG. 6, the slope detector circuit SPDET may detect a slope of the output voltage signal VOUT of the power converter to generate a voltage slope detected signal VSES.

It is worth noting that, as shown in FIG. 6, when the slope detector circuit SPDET detects that an output voltage of the output voltage signal VOUT of the power converter drops sharply, and the slope of the output voltage signal VOUT or a slope of the voltage slope detected signal VSES is larger than a slope threshold, the slope detector circuit SPDET outputs a transient enhanced signal TRANEN to the switch controller circuit SWCN. A rising edge of a pulse wave of the transient enhanced signal TRANEN is aligned with a starting point from which the output voltage of the output voltage signal VOUT drops sharply. A falling edge of the pulse wave of the transient enhanced signal TRANEN is aligned with a transition point from which the output voltage signal VOUT stops falling and begins to rise.

As shown in FIG. 1, the switch controller circuit SWCN is connected to the slope detector circuit SPDET and the upper bridge switch Q2. The switch controller circuit SWCN may output a switch control signal to the upper bridge switch Q2 to turn on the upper bridge switch Q2, that is, the upper bridge switch Q2 is conducted, during a duty cycle of the pulse wave of the transient enhanced signal TRANEN, according to the transient enhanced signal TRANEN from the slope detector circuit SPDET.

As shown in FIG. 6, when the output voltage of the output voltage signal VOUT of the power converter stops falling and begins to rise, the duty cycle of the transient enhanced signal TRANEN generated by the slope detector circuit SPDET ends. At this time, an inductor current IL flowing through the storage inductor L1 increases to be equal to a load current ILOAD flowing through a load of a system connected to the output terminal of the power converter. As shown in FIG. 6, the falling edge of the pulse wave of the transient enhanced signal TRANEN is aligned with a time point at which a waveform of the inductor current IL rises to be equal to the load current ILOAD.

That is, the duty cycle of the transient enhanced signal TRANEN of the slope detector circuit SPDET depends on voltage drop of the output voltage signal VOUT of the power converter drops and the slope of the output voltage signal VOUT or the voltage slope detected signal VSES. As shown in FIG. 6, the falling edge of the pulse wave of the transient enhanced signal TRANEN of the slope detector circuit SPDET is aligned with a lowest point at which a lowest output voltage of the output voltage signal VOUT is generated by the power converter.

As shown in FIG. 1, the power converter may include a voltage driver circuit. The voltage driver circuit includes a first resistor R1 and a second resistor R2. One terminal of the first resistor R1 is connected to the output terminal of the power converter between the storage inductor L1 and the first capacitor C1. The other terminal of the first resistor R1 is connected to one terminal of the second resistor R2. The other terminal of the second resistor R2 is grounded. The slope detector circuit SPDET may be connected to or contacted with a feedback node between the first resistor R1 and the second resistor R2. The voltage driver circuit generates a feedback voltage signal VFB at the feedback node based on the output voltage of the output voltage signal VOUT.

Alternatively, the slope detector circuit SPDET detects the feedback voltage signal VFB at the feedback node between the first resistor R1 and the second resistor R2, instead of the output voltage signal VOUT from the output terminal of the power converter between the storage inductor L1 and the first capacitor C1 as described above.

It is worth noting that, when the slope detector circuit SPDET detects that a voltage of the feedback voltage signal VFB of the power converter drops sharply, and a slope of the feedback voltage signal VFB is larger than the slope threshold, the slope detector circuit SPDET outputs the transient enhanced signal TRANEN to the switch controller circuit SWCN. The switch controller circuit SWCN is configured to output the switch control signal to the upper bridge switch Q2 according to the transient enhanced signal TRANEN to turn on the upper bridge switch Q2, that is, the upper bridge switch Q2 is conducted during the duty cycle of the pulse wave of the transient enhanced signal TRANEN. The duty cycle of the transient enhanced signal TRANEN depends on the slope of the feedback voltage signal VFB.

Figure 7:
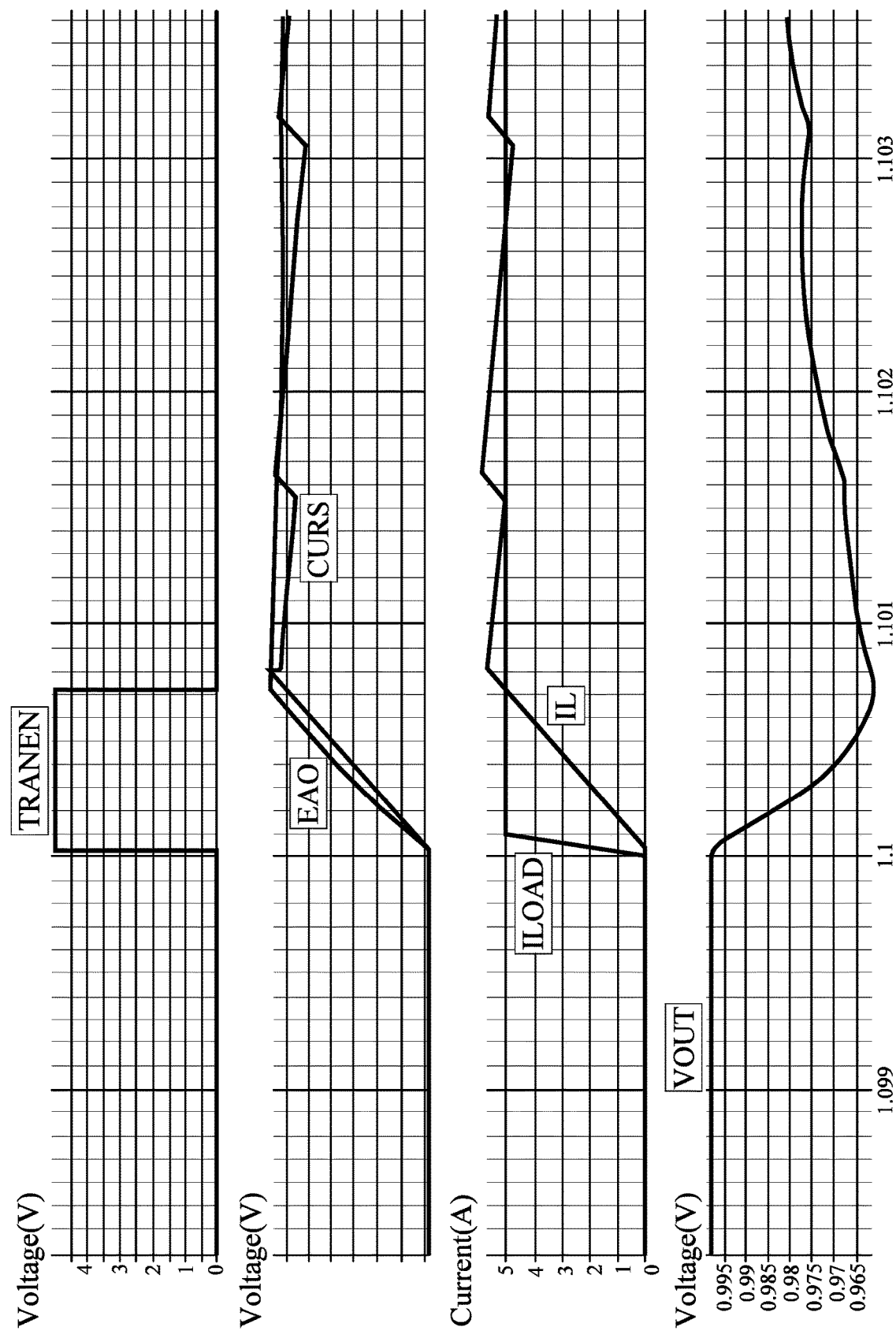
FIG. 7 is a waveform diagram of a transient enhanced signal, an error amplified signal, a voltage signal, a load current signal, an inductor current signal and an output voltage signal of the fast transient current mode control circuit and method according to the embodiment of the present disclosure.

Reference is made to FIGS. 1 and 7, wherein FIG. 1 is a circuit layout diagram of a fast transient current mode control circuit according to an embodiment of the present disclosure, and FIG. 7 is a waveform diagram of a transient enhanced signal, an error amplified signal, a voltage signal, a load current signal, an inductor current signal and an output voltage signal of the fast transient current mode control circuit and method according to the embodiment of the present disclosure.

As shown in FIG. 1, in the embodiment, the fast transient current mode control circuit includes the slope detector circuit SPDET, the switch controller circuit SWCN, the current sensor circuit CSE, the oscillator circuit OSC and the buffer circuit, and is applicable for the power converter. The buffer circuit includes the buffer BUF1 and the switching switch SW1.

The power converter further includes an error amplifier EA and a comparator COM1. A sensing terminal of the current sensor circuit CSE may be connected to the node LX between the upper bridge switch Q2 and the lower bridge switch Q1. The current sensor circuit CSE is configured to sense the inductor current flowing through the storage inductor L1 to output a voltage signal to the buffer BUF1 and the switching switch SW1 of the buffer circuit.

A control terminal of the switching switch SW1 of the buffer circuit is connected to an output terminal of the slope detector circuit SPDET. A first buffer input terminal such as a non-inverting terminal of the buffer BUF1 of the buffer circuit is connected to an output terminal of the current sensor circuit CSE. A second buffer input terminal such as an inverting terminal of the buffer BUF1 is connected to an output terminal of the buffer BUF1. A first terminal of the switching switch SW1 is connected to the output terminal of the buffer BUF1. A second terminal of the switching switch SW1 is connected to a node between a third resistor R3 and a third capacitor C3. It should be understood that a voltage of the second buffer input terminal of the buffer BUF1 is equal to a voltage of the first buffer input terminal of the buffer BUF1.

A first comparison input terminal such as a non-inverting terminal of the comparator COM1 is connected to the output terminal of the current sensor circuit CSE. A second comparison input terminal such as an inverting terminal of the comparator COM1 is connected to a non-grounded terminal of a second capacitor C2. An output terminal of the comparator COM1 is connected to the switch controller circuit SWCN.

One terminal of the error amplifier EA is connected to the feedback node between the first resistor R1 and the second resistor R2 of the voltage driver. The other terminal of the error amplifier EA is connected to a reference voltage source for providing a reference voltage VR1. The error amplifier EA is grounded through the second capacitor C2. The second capacitor C2 is connected in parallel to a series circuit of the third resistor R3 and the third capacitor C3.

It is worth noting that, as shown in FIG. 7, when the output voltage of the output voltage signal VOUT of the power converter drops sharply, and the slope of the output voltage signal VOUT is larger than the slope threshold, the slope detector circuit SPDET outputs the transient enhanced signal TRANEN to the switch controller circuit SWCN and the switching switch SW1. The transient enhanced signal TRANEN generated by the slope detector circuit SPDET has the pulse wave. The rising edge of the pulse wave of transient enhanced signal TRANEN is aligned with the starting point from which the output voltage of the output voltage signal VOUT drops sharply. The falling edge of the pulse wave of transient enhanced signal TRANEN is aligned with the transition point from which the output voltage signal VOUT stops falling and begins to rise. The transition point is a point at which the lowest output voltage of the output voltage signal VOUT is generated.

The switch controller circuit SWCN receives the transient enhanced signal TRANEN from the slope detector circuit SPDET. The switch controller circuit SWCN outputs the switch control signal to the upper bridge switch Q2 according to the transient enhanced signal TRANEN to turn on the bridge switch Q2 during the duty cycle of the pulse wave of the transient enhanced signal TRANEN. At the same time, the switching switch SW1 is turned on by the transient enhanced signal TRANEN of the slope detector circuit SPDET.

When the switching switch SW1 is turned on, the switching switch SW1 allows a conduction path to be formed between the buffer BUF1 and the error amplifier EA. As a result, a voltage of the node between the third resistor R3 and the third capacitor C3 is equal to a voltage of the first buffer input terminal of the buffer BUF1 and a voltage of the second buffer input terminal of the buffer BUF1. The current sensor circuit CSE detects the inductor current of the storage inductor L1 to output a voltage signal such that the voltage of the voltages of the first and second buffer input terminals of the buffer BUF1 increase. As a result, the voltage at the node between the third resistor R3 and the third capacitor C3 increases such that an error amplified signal EAO of the error amplifier EA increases. On the other hand, the current sensor circuit CSE detects the inductor current of the storage inductor L1 to output a voltage signal CURS such that a voltage of the first comparison input terminal of the comparator COM1 increases.

As shown in FIG. 7, a voltage of the error amplified signal EAO outputted by the error amplifier EA increases to be equal to a target voltage during the duty cycle of the pulse wave of the transient enhanced signal TRANEN. In detail, the starting point from which the voltage of the error amplified signal EAO increases is aligned with the rising edge of the pulse wave of the transient enhanced signal TRANEN. After the duty cycle of the pulse wave of the transient enhanced signal TRANEN ends, the error amplified signal EAO tends to have a constant voltage.

Figure 2:
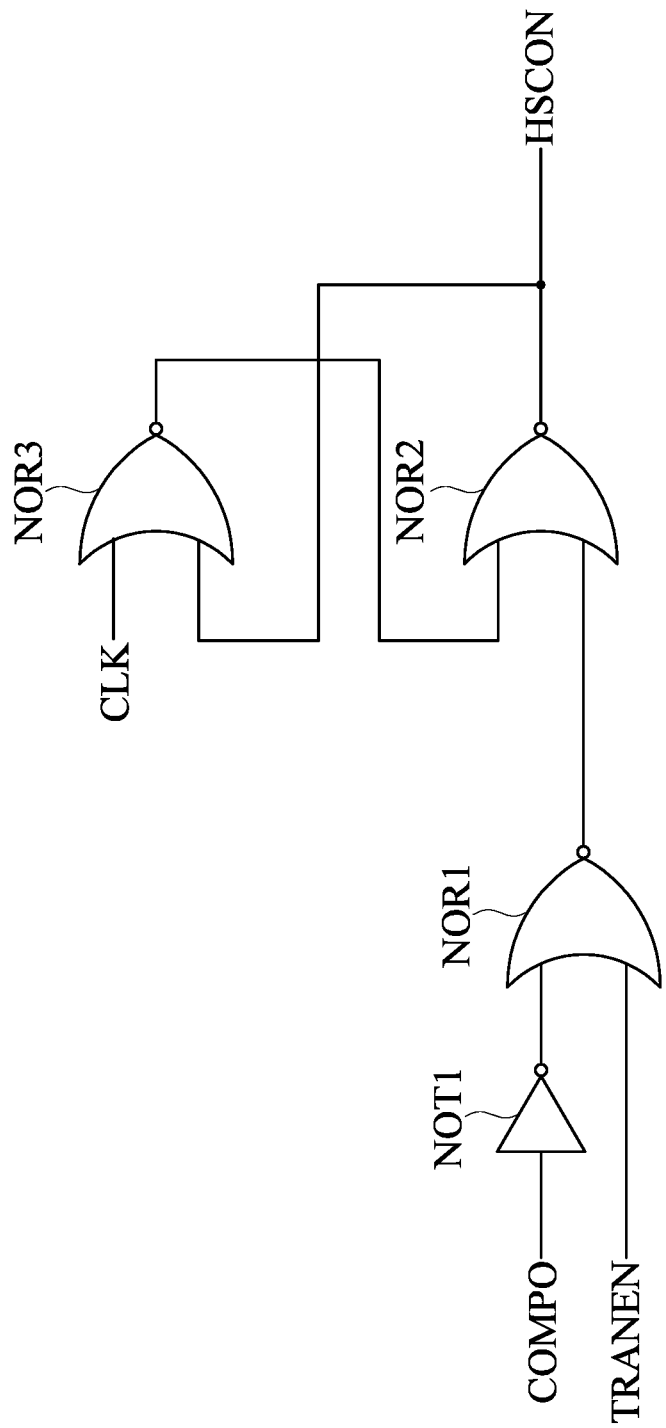
FIG. 2 is a circuit layout diagram of a switch controller circuit of the fast transient current mode control circuit according to the embodiment of the present disclosure.

Reference is made to FIGS. 1, 2 and 7, wherein FIG. 1 is a circuit layout diagram of a fast transient current mode control circuit according to an embodiment of the present disclosure; FIG. 2 is a circuit layout diagram of a switch controller circuit of the fast transient current mode control circuit according to the embodiment of the present disclosure; FIG. 7 is a waveform diagram of a transient enhanced signal, an error amplified signal, a voltage signal, a load current signal, an inductor current signal and an output voltage signal of the fast transient current mode control circuit and method according to the embodiment of the present disclosure.

As shown in FIG. 1, in the embodiment, the fast transient current mode control circuit includes the slope detector circuit SPDET, the switch controller circuit SWCN, the current sensor circuit CSE, the oscillator circuit OSC and the buffer circuit, and is applicable for the power converter. The buffer circuit includes the buffer BUF1 and the switching switch SW1.

As shown in FIG. 2, the switch controller circuit SWCN includes a first NOR gate NOR1, a second NOR gate NOR2, a third NOR gate NOR3 and a first NOT gate NOT1.

An input terminal of the first NOR gate NOR1 is connected to the output terminal of the comparator COM1 shown in FIG. 1. The first NOR gate NOR1 is configured to receive a first comprising signal COMPO from the comparator COM1.

One input terminal of the first NOR gate NOR1 is connected to the output terminal of slope detector circuit SPDET shown in FIG. 1. The other terminal of the first NOR gate NOR1 is connected to an output terminal of the first NOR gate NOR1 shown in FIG. 2. The first NOR gate NOR1 is configured to receive the inverted first comprising signal COMPO from the first NOT gate NOT1, and receive the transient enhanced signal TRANEN from the slope detector circuit SPDET.

One input terminal of the second NOR gate NOR2 is connected to the output terminal of the first NOR gate NOR1. The other terminal of the second NOR gate NOR2 is connected to an output terminal of the third NOR gate NOR3. One input terminal of the third NOR gate NOR3 is connected to an output terminal of the second NOR gate NOR2 shown in FIG. 2. The other terminal of the third NOR gate NOR3 is connected to an output terminal of the oscillator circuit OSC shown in FIG. 1. The output terminal of the second NOR gate NOR2 is connected to a control terminal of the upper bridge switch Q2 of the power converter shown in FIG. 1.

For example, when the first NOR gate NOR1 receives the transient enhanced signal TRANEN at a high level, the first NOR gate NOR1 outputs a first NOR gate signal at a low level to the second NOR gate NOR2 during the duty cycle of the transient enhanced signal TRANEN shown in FIG. 7. When the oscillator circuit OSC outputs a clock signal CLK at a high level to the third NOR gate NOR3, the third NOR gate NOR3 outputs a third NOR gate signal at a low level to the second NOR gate NOR2. The second NOR gate NOR2 outputs a switch control signal HSCON at a high level to the upper bridge switch Q2 of the power converter to turn on the upper bridge switch Q2, according to the first NOR gate signal at the low level and the third NOR gate signal at the low level.

Therefore, the upper bridge switch Q2 is turned on during the duty cycle of the transient enhanced signal TRANEN of the slope detector circuit SPDET. As a result, during the duty cycle of the transient enhanced signal TRANEN, the voltage of the error amplified signal EAO outputted by the error amplifier EA can quickly increase to be equal to the target voltage, and the inductor current IL of the storage inductor L1 can quickly increase to be equal to the load current ILOAD flowing through the system connected to the output terminal of the power converter.

Figure 10:
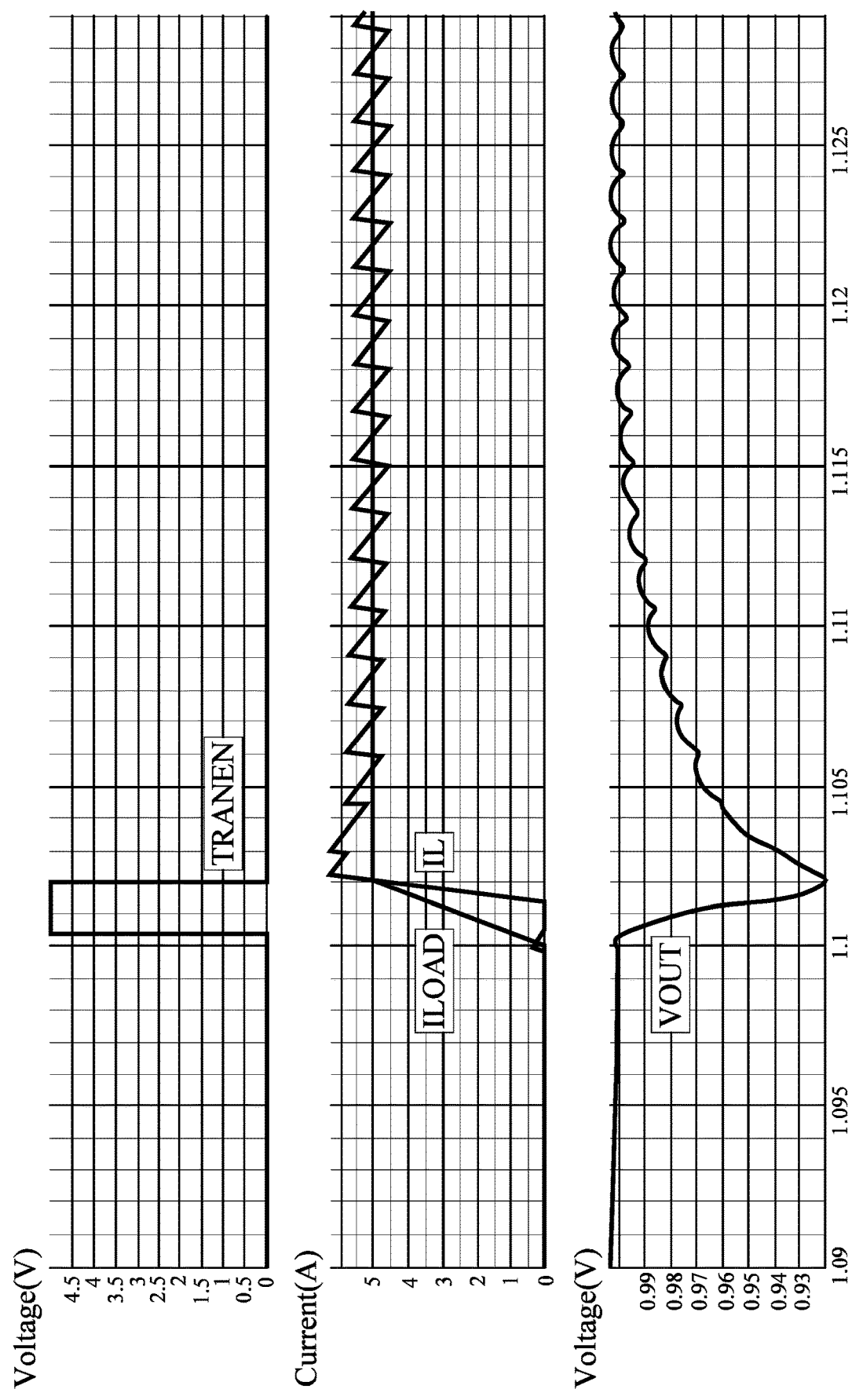
FIG. 10 is a waveform diagram of a transient enhanced signal, a load current signal, an inductor current signal and an output voltage signal of the fast transient current mode control circuit and method according to the embodiment of the present disclosure.
Figure 12:
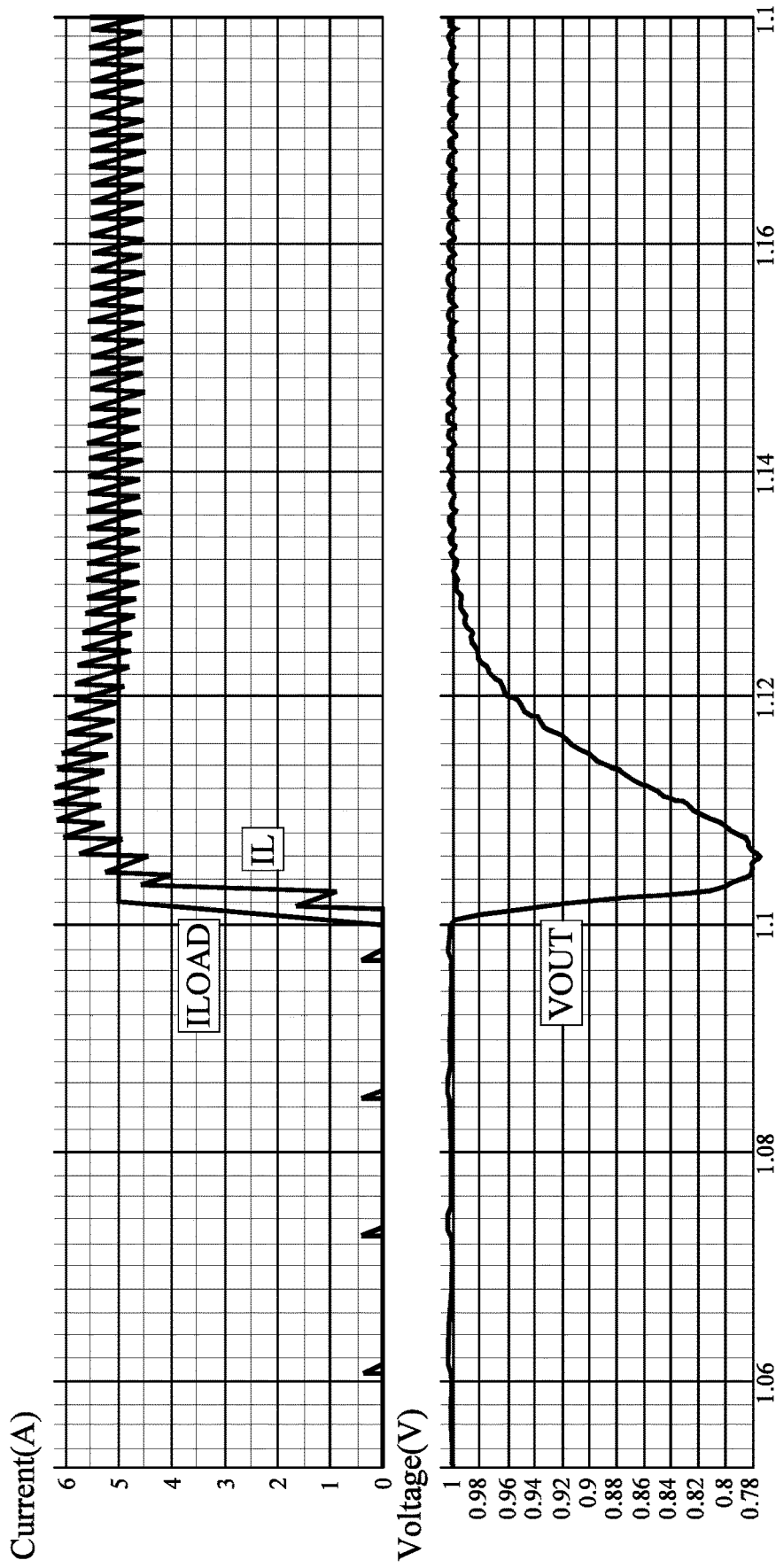
FIG. 12 is a waveform diagram of a transient enhanced signal, a load current signal, an inductor current signal and an output voltage signal of a conventional transient current mode control circuit.

Reference is made to FIGS. 1, 10 and 12, wherein FIG. 1 is a circuit layout diagram of a fast transient current mode control circuit according to an embodiment of the present disclosure; FIG. 10 is a waveform diagram of a transient enhanced signal, a load current signal, an inductor current signal and an output voltage signal of the fast transient current mode control circuit and method according to the embodiment of the present disclosure; and FIG. 12 is a waveform diagram of a transient enhanced signal, a load current signal, an inductor current signal and an output voltage signal of a conventional transient current mode control circuit.

Figure 3:
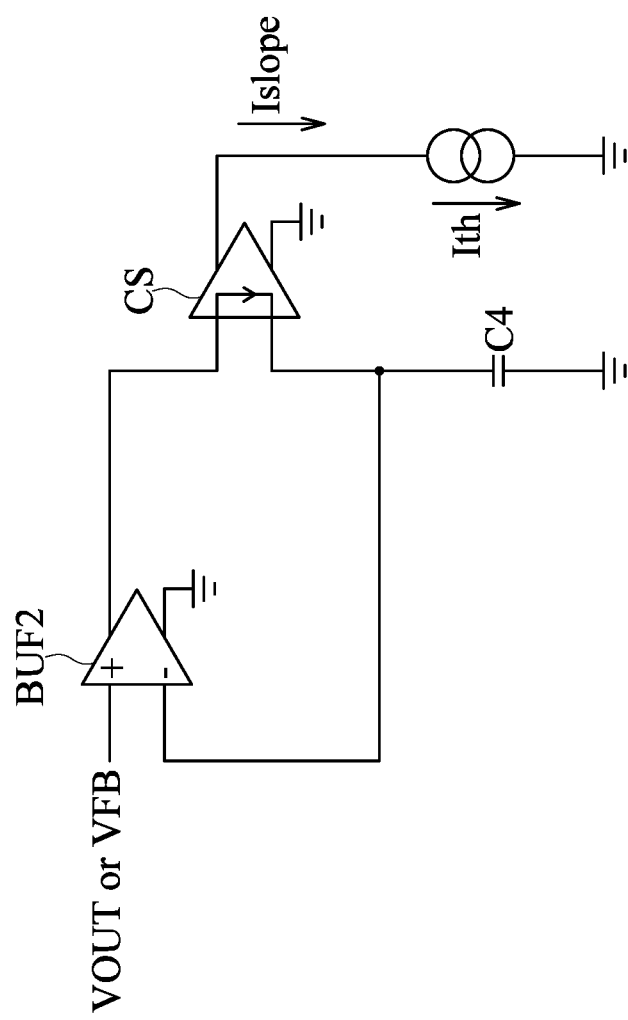
FIG. 3 is a circuit layout diagram of a slope detector circuit of the fast transient current mode control circuit according to the embodiment of the present disclosure.

As shown in FIG. 12, when the conventional transient current mode control circuit is applied to the power converter, the power converter has low operational efficiency such that an output voltage signal VOUT of the power converter drops an output voltage of 220 mV. It should be understood that the output voltage signal VOUT of the conventional power converter may drop much more electrical power, depending on parameters of the pumping of the load. In contrast, when the fast transient current mode control circuit of the embodiment of the present disclosure as shown in FIGS. 1 to 3 is applied to the power converter, the power converter drops only 80 mV as shown in FIG. 10. Accordingly, the operational efficiency of the power converter can be effectively improved such that the power converter drops much less electrical power, by using the fast transient current mode control circuit of the embodiment of the present disclosure.

Figure 8:
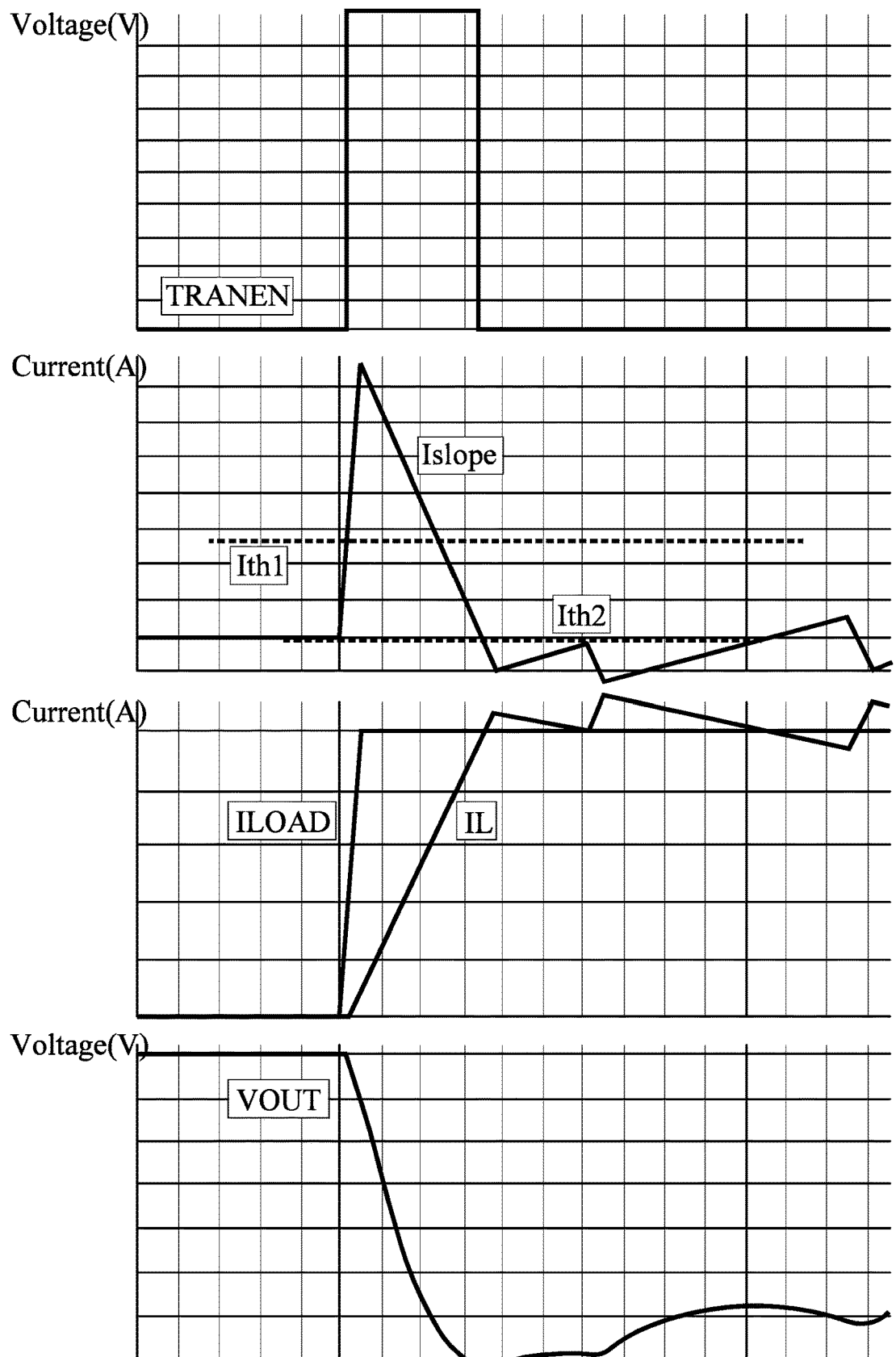
FIG. 8 is a waveform diagram of a transient enhanced signal, a current slope sensed signal, a load current signal, an inductor current signal and an output voltage signal of the fast transient current mode control circuit and method according to the embodiment of the present disclosure.

Reference is made to FIGS. 1, 3 and 8, wherein FIG. 1 is a circuit layout diagram of a fast transient current mode control circuit according to an embodiment of the present disclosure; FIG. 3 is a circuit layout diagram of a slope detector circuit of the fast transient current mode control circuit according to the embodiment of the present disclosure; and FIG. 8 is a waveform diagram of a transient enhanced signal, a current slope sensed signal, a load current signal, an inductor current signal and an output voltage signal of the fast transient current mode control circuit and method according to the embodiment of the present disclosure.

As shown in FIG. 1, in the embodiment, the fast transient current mode control circuit includes the slope detector circuit SPDET, the switch controller circuit SWCN, the current sensor circuit CSE, the oscillator circuit OSC and the buffer circuit, and is applicable for the power converter. The buffer circuit includes the buffer BUF1 and the switching switch SW1.

As shown in FIG. 3, the slope detector circuit SPDET includes a buffer BUF2, a current sensor CS, a reference current source for providing a reference current Ith, and a capacitor C4. One terminal of the buffer BUF2 shown in FIG. 3 is connected to or contacted with the feedback node between the first resistor R1 and the second resistor R2 of the voltage driver of the power converter as shown in FIG. 1. The other terminal of the buffer BUF2 is connected to one terminal of the capacitor C4. The other terminal of the capacitor C4 is grounded.

The current sensor CS is connected to the buffer BUF2 and the capacitor C4. The current sensor CS is configured to sense a current flowing from the buffer BUF2 to the capacitor C4 to generate a current slope sensing signal Islope.

In addition, the slope detector circuit SPDET may further include a comparator or other comparator circuits (not shown), which is configured to compare the current slope sensing signal Islope with the reference current signal Ith provided by the reference current source to determine whether or not the transient enhanced signal TRANEN is outputted to the switch controller circuit SWCN and the switching switch SW1.

More specifically, the reference current signal Ith may include a first current threshold Ith1 and a second current threshold Ith2. As shown in FIG. 8, when the comparator of the slope detector circuit SPDET determines that a current of the current slope sensing signal Islope that is lower than a current of the first current threshold Ith1 increases to be larger than the current of the first current threshold Ith1, or a slope of a waveform of the current slope sensing signal Islope is larger than a slope threshold, the comparator of the slope detector circuit SPDET outputs the transient enhanced signal TRANEN. When the switch controller circuit SWCN receives the transient enhanced signal TRANEN having a pulse wave at a high level, the switch controller circuit SWCN turns on the upper bridge switch Q2, such that the voltage of the error amplified signal EAO increases to be equal to the target voltage, and the inductor current IL of the inductor L1 increases to be equal to the load current ILOAD flowing through the system connected to the output terminal of the power converter.

Further, when the comparator of the slope detector circuit SPDET determines that the current of the waveform of the current slope sensing signal Islope that is higher than the current of the first current threshold Ith1 decreases to be lower than a current of a second current threshold Ith2, the comparator of the slope detector circuit SPDET outputs the transient enhanced signal TRANEN at a low level to instruct the switch controller circuit SWCN to turn off the upper bridge switch Q2.

Figure 4:
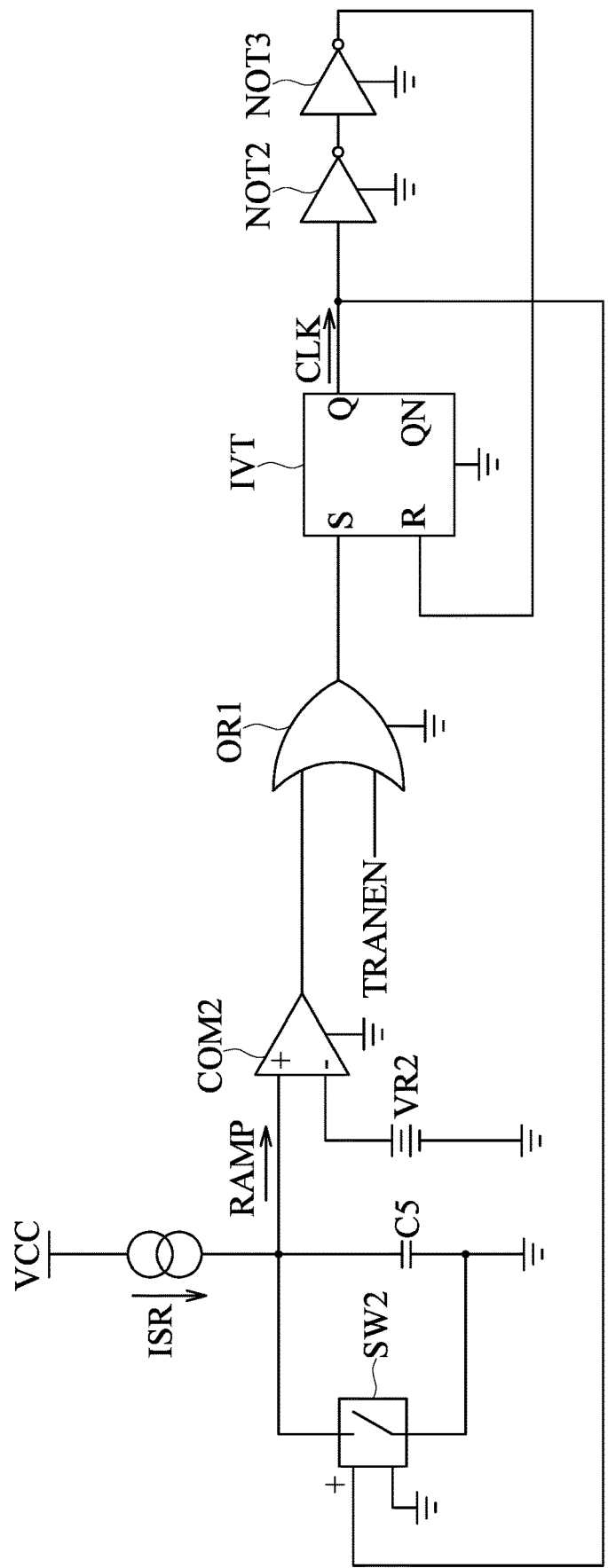
FIG. 4 is a circuit layout diagram of an oscillator circuit of the fast transient current mode control circuit according to the embodiment of the present disclosure.
Figure 9:
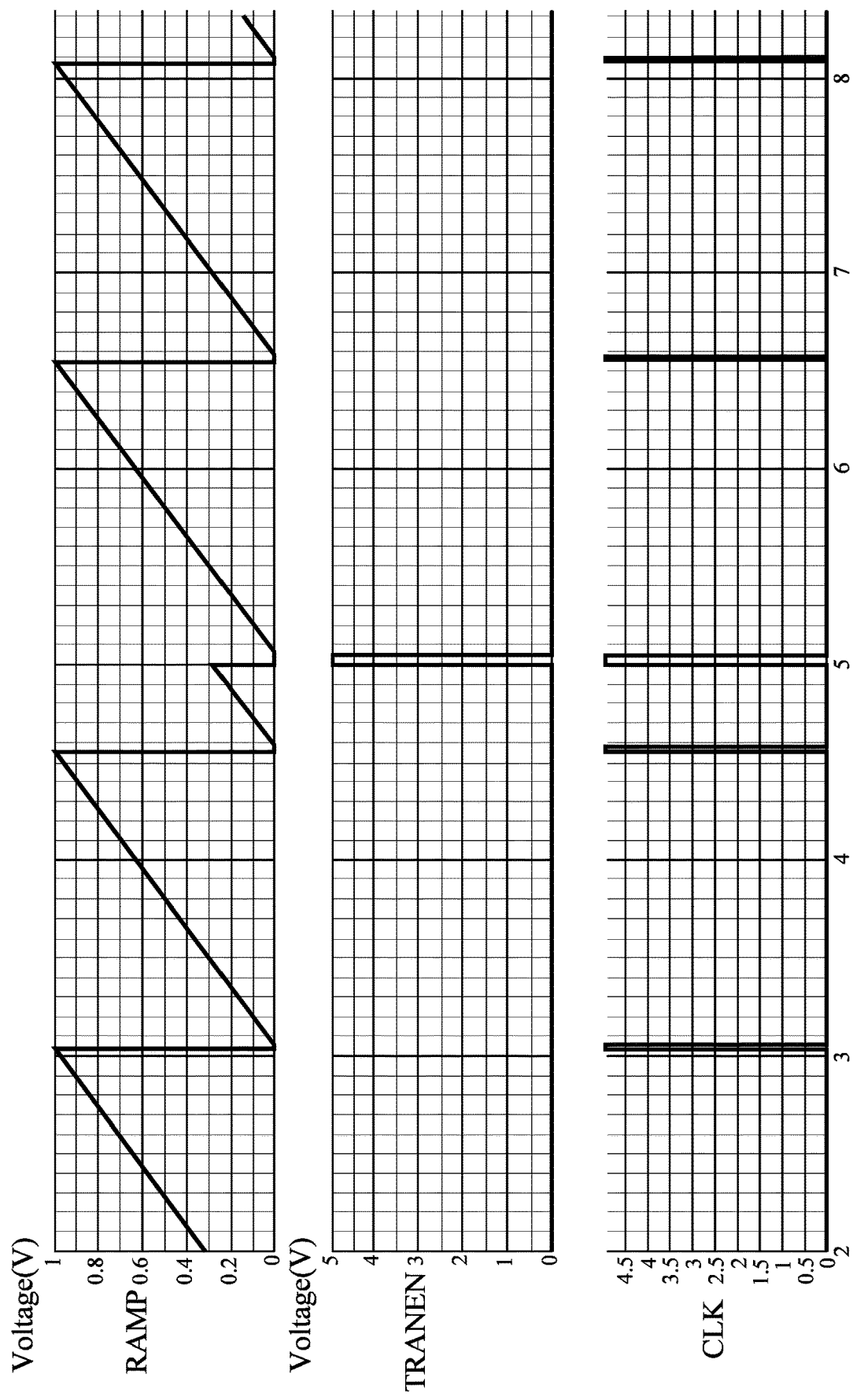
FIG. 9 is a waveform diagram of a ramp signal, a transient enhanced signal and a clock signal of the fast transient current mode control circuit and method according to the embodiment of the present disclosure.

Reference is made to FIGS. 1, 4 and 9, wherein FIG. 1 is a circuit layout diagram of a fast transient current mode control circuit according to an embodiment of the present disclosure; FIG. 4 is a circuit layout diagram of an oscillator circuit of the fast transient current mode control circuit according to the embodiment of the present disclosure; FIG. 9 is a waveform diagram of a ramp signal, a transient enhanced signal and a clock signal of the fast transient current mode control circuit and method according to the embodiment of the present disclosure.

As shown in FIG. 1, in the embodiment, the fast transient current mode control circuit includes the slope detector circuit SPDET, the switch controller circuit SWCN, the oscillator circuit OSC and the buffer circuit, and is applicable for the power converter. The oscillator circuit OSC is connected to the switch controller circuit SWCN and configured to provide the clock signal CLK to the switch controller circuit SWCN.

As shown in FIG. 4, in the embodiment, the oscillator circuit OSC includes an inverter IVT, a constant current source ISR, a capacitor C5, a comparator COM2, a switching switch SW2, a NOT gate NOT2 and a NOT gate NOT3. For example, in the embodiment, the inverter IVT is an SR inverter, but the present disclosure is not limited thereto.

The constant current source ISR is connected between a voltage source VCC and a first terminal of the capacitor C5. A second terminal of the capacitor C5 is grounded. The switching switch SW2 is connected in parallel to the capacitor C5. Two input terminals of the comparator COM2 are respectively connected to the first terminal of the capacitor C5 and a reference voltage source for providing a reference voltage VR2.

It is worth noting that, as shown in FIG. 4, in the embodiment, the oscillator circuit OSC further includes a OR gate OR1. One input terminal of the OR gate OR1 is connected to an output terminal of the comparator COM2. The other input terminal of the OR gate OR1 is connected to the output terminal of slope detector circuit SPDET shown in FIG. 1. A set terminal S of the inverter IVT is connected to an output terminal of the OR gate OR1. An output terminal of the inverter IVT is connected to the switch controller circuit SWCN. The output terminal of the inverter IVT is connected to an input terminal of the NOT gate NOT2. An output terminal of the NOT gate NOT2 is connected to an input terminal of the NOT gate NOT3. An output terminal of the NOT gate NOT3 is connected to a reset terminal R of the inverter IVT.

When the slope detector circuit SPDET detects that the voltage of the output voltage signal VOUT or the feedback voltage signal VFB of the power converter drops sharply, and a slope of the output voltage signal VOUT or the feedback voltage signal VFB is larger than the slope threshold, the slope detector circuit SPDET outputs the transient enhanced signal TRANEN at a high level as shown in FIG. 9 to the OR gate OR1. The OR gate OR1 outputs an OR signal at a high level to the set terminal of the inverter IVT according to the transient enhanced signal TRANEN at the high level. The inverter IVT outputs the clock signal CLK having the pulse wave to the switch controller circuit SWCN to trigger the switch controller circuit SWCN to turn on the upper bridge switch Q2 for a period of time, according to the OR signal at the high level.

Since the upper bridge switch Q2 is turned on, during a duty cycle of the clock signal CLK, the voltage of the error amplified signal EAO outputted by the error amplifier EA can quickly increase to be equal to the target voltage, and the inductor current IL of the storage inductor L1 can quickly increase to be equal to the load current ILOAD flowing through the system connected to the output terminal of the power converter.

As shown in FIG. 9, a rising edge of a pulse wave of the clock signal CLK is aligned with the rising edge of the pulse wave of the transient enhanced signal TRANEN. A falling edge of the pulse wave of the clock signal CLK is aligned with the falling edge of the pulse wave of the transient enhanced signal TRANEN. After the duty cycles of the pulse wave of the transient enhanced signal TRANEN and the pulse wave of the clock signal CLK end, the clock signal CLK is transmitted sequentially through the NOT gate NOT2 and the NOT gate NOT3 to the reset terminal R of the inverter IVT to trigger the inverter IVT to reset.

Figure 11:
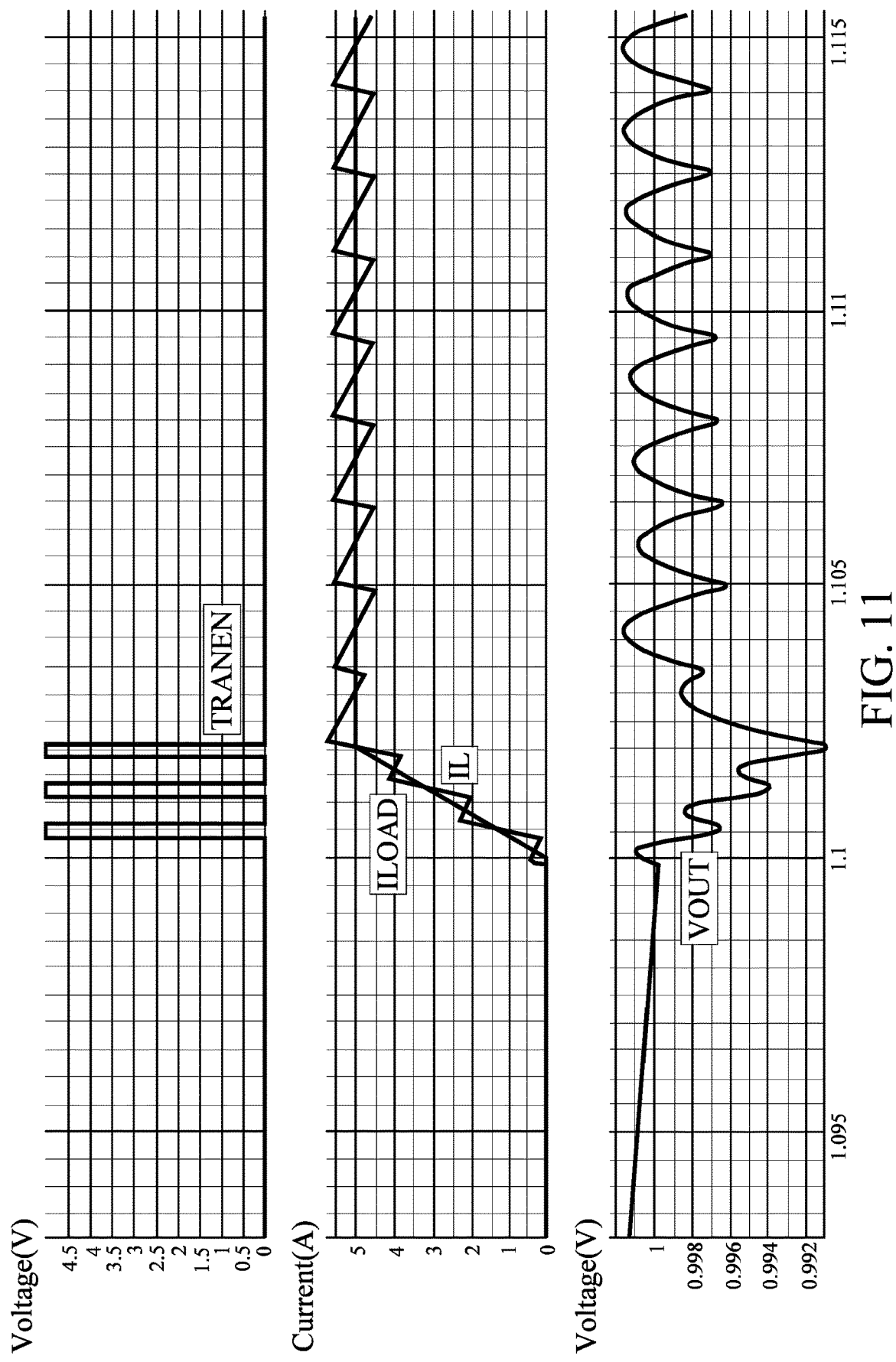
FIG. 11 is a waveform diagram of a transient enhanced signal, a load current signal, an inductor current signal and an output voltage signal of the fast transient current mode control circuit and method according to the embodiment of the present disclosure.

Reference is made to FIGS. 1, 4, 11 and 12, wherein FIG. 11 is a waveform diagram of a transient enhanced signal, a load current signal, an inductor current signal and an output voltage signal of the fast transient current mode control circuit and method according to the embodiment of the present disclosure, and FIG. 12 is a waveform diagram of a transient enhanced signal, a load current signal, an inductor current signal and an output voltage signal of a conventional transient current mode control circuit.

It is assumed that the oscillator circuit OSC of the fast transient current mode control circuit shown in FIG. 1 does not include the OR gate OR1 as shown in FIG. 4. Under this condition, when the comparator COM2 determines that a voltage of a ramp signal RAMP of the capacitor C5 is higher than the reference voltage VR2, the inverter IVT outputs a constant clock signal to the switch controller circuit SWCN. The oscillator circuit OSC may need to wait for a period of time after the slope detector circuit SPDET detects that that the voltage of the output voltage signal VOUT or the feedback voltage signal VFB of the power converter drops sharply, and the slope of the output voltage signal VOUT or the feedback voltage signal VFB is larger than the slope threshold. After waiting for a period of time, the oscillator circuit OSC outputs the constant clock signal having a pulse wave at a high level to the switch controller circuit SWCN. Therefore, the switch controller circuit SWCN may not be immediately triggered to turn on the switching switch SW1.

As a result, the fast transient current mode control circuit of the embodiment of the present disclosure as shown in FIG. 10 has better performance than the conventional power converter which drops 220 mV as shown in FIG. 12, but still drops 80 mV.

Therefore, the fast transient current mode control circuit shown in FIG. 1 further includes the oscillator circuit OSC, which mainly includes the OR gate OR1 as shown in FIG. 4. Under this condition, as shown in FIG. 11, the power converter only drops 9 mV, instead of 80 mV. Accordingly, in the embodiment of the present disclosure, the performance of the power converter can be effectively improved and thus the power converter drops much less power.

Figure 5:
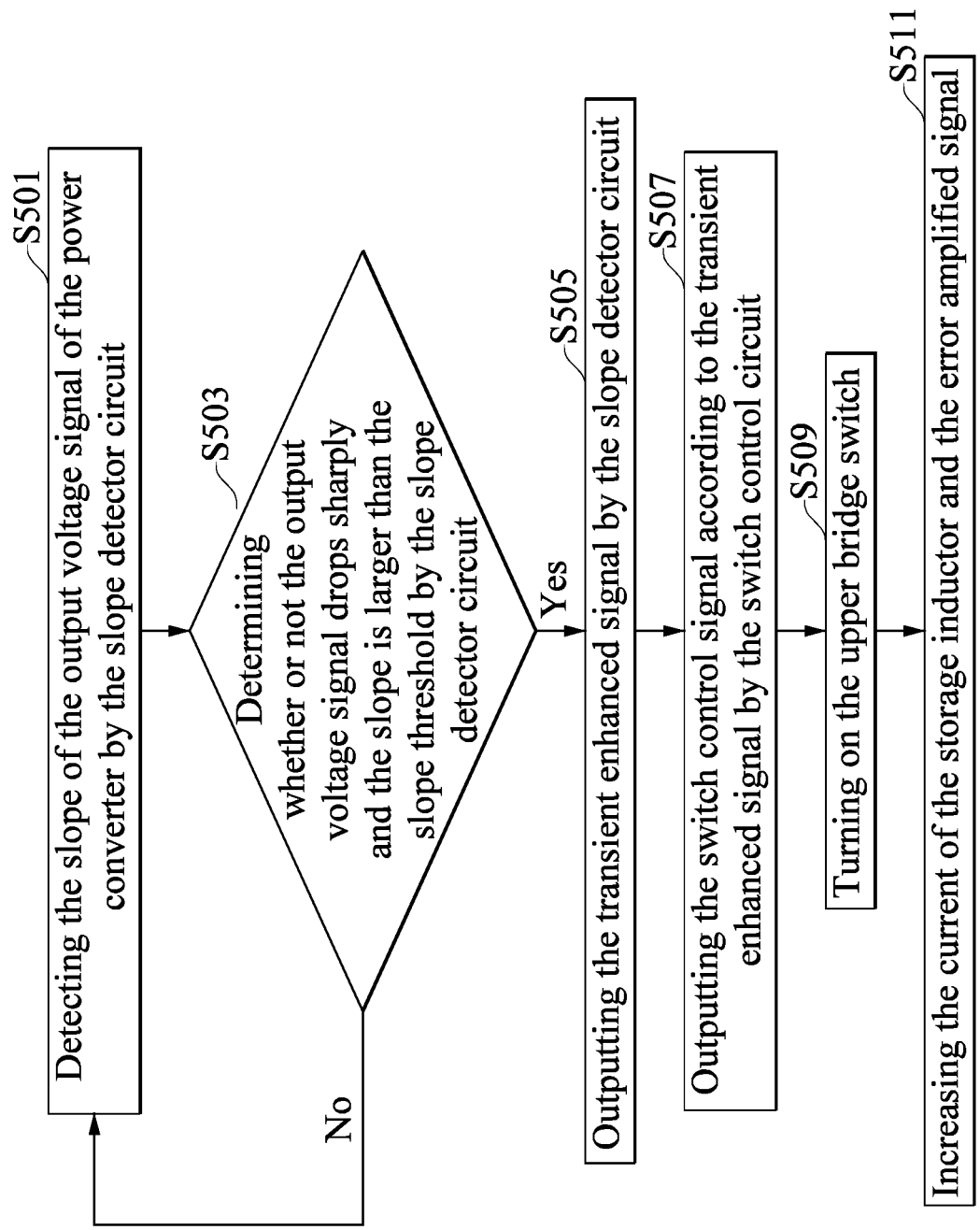
FIG. 5 is a flowchart diagram of a fast transient current mode control method according to the embodiment of the present disclosure.

Reference is made to FIGS. 1 and 5, wherein FIG. 1 is a circuit layout diagram of a fast transient current mode control circuit according to an embodiment of the present disclosure, and FIG. 5 is a flowchart diagram of a fast transient current mode control method according to the embodiment of the present disclosure. As shown in FIG. 5, in the embodiment, the fast transient current mode control method includes the following steps S501 to S511, which uses the above fast transient current mode control system and is applicable to the power converter.

In step S501, the slope detector circuit SPDET detects the slope of the output voltage signal VOUT from the output terminal of the power converter at the node between the storage inductor L1 and the first capacitor C1 of the power converter.

In step S503, the slope detector circuit SPDET determines whether or not the output voltage of the output voltage signal VOUT drops sharply and whether or not the slope of the output voltage signal VOUT is larger than the slope threshold.

If the output voltage of the output voltage signal VOUT does not drop sharply or the slope of the output voltage signal VOUT is not larger than the slope threshold, step S501 is performed again. Conversely, if the output voltage of the output voltage signal VOUT drops sharply and the slope of the output voltage signal VOUT is larger than the slope threshold, step S505 is performed.

In step S505, the slope detector circuit SPDET outputs the transient enhanced signal TRANEN. The transient enhanced signal TRANEN has the pulse wave. The rising edge of the pulse wave of the transient enhanced signal TRANEN is aligned with the starting point from which the output voltage of the output voltage signal VOUT drops sharply. The falling edge of the pulse wave of transient enhanced signal TRANEN is aligned with the transition point from which the output voltage signal VOUT stops falling.

In step S507, the switch controller circuit SWCN outputs the switch control signal HSCON to the upper bridge switch Q2 according to the transient enhanced signal TRANEN.

In step S509, the upper bridge switch Q2 is turned on during the duty cycle of the pulse wave of the transient enhanced signal TRANEN according to the switch controller circuit SWCN.

In step S511, during the duty cycle of the transient enhanced signal TRANEN, the voltage of the error amplified signal EAO outputted by the error amplifier EA can quickly increase to be equal to the target voltage, and the inductor current IL of the storage inductor L1 can quickly increase to be equal to the load current ILOAD flowing through the system connected to the output terminal of the power converter.

In summary, the present disclosure provides the fast transient current mode control circuit and method, which use the switch controller circuit to turn on the upper bridge switch when the slope detector circuit SPDET detects that the slope of the output voltage of the power converter or the feedback voltage that is divided from the output voltage is larger than the slope threshold. As a result, during pumping of the load of the system at the output terminal of the power converter, the inductor current of the storage inductor can quickly increase to be equal to the current flowing through the load of the system and the voltage of the error amplified signal output by the error amplifier can quickly increase to be equal to the target voltage. Therefore, the power converter can have improved operational efficiency and drops much less electrical power.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A fast transient current mode control circuit, which is applicable for a power converter, the power converter including an upper bridge switch, a lower bridge switch, a storage inductor and a first capacitor, the upper bridge switch being connected to the lower bridge switch, one terminal of the storage inductor being connected to a node between the upper bridge switch and the lower bridge switch, the other terminal of the storage inductor being grounded through the first capacitor, the fast transient current mode control circuit comprising:
    a slope detector circuit connected to or contacted with an output terminal of the power converter between the storage inductor and the first capacitor, configured to detect an output voltage signal from the output terminal of the power converter between the storage inductor and the first capacitor, and wherein when an output voltage of the output voltage signal drops sharply and a slope of the output voltage signal is larger than a slope threshold, the slope detector circuit is configured to output a transient enhanced signal having a pulse wave, a rising edge of the pulse wave is aligned with a starting point from which the output voltage signal drops sharply, and a falling edge of the pulse wave is aligned with a transition point from which the output voltage signal stops falling and turns to rise;
    a switch controller circuit connected to the slope detector circuit and the upper bridge switch, and configured to output a switch control signal to the upper bridge switch to turn on the upper bridge switch during a duty cycle of the pulse wave according to the transient enhanced signal, such that an inductor current flowing through the storage inductor increases to be equal to a load current flowing through a load of a system connected to the output terminal of the power converter; and
    an oscillator circuit connected to the switch controller circuit and configured to provide a clock signal to the switch controller circuit.

2. The fast transient current mode control circuit of claim 1, wherein the power converter further includes a voltage driver circuit, the voltage driver circuit includes a first resistor and a second resistor, one terminal of the first resistor is connected to the output terminal of the power converter between the storage inductor and the first capacitor, the other terminal of the first resistor is connected to one terminal of the second resistor, the other terminal of the second resistor is grounded, the slope detector circuit is connected to or contacted with a feedback node between the first resistor and the second resistor, the voltage driver circuit generates a feedback voltage signal at the feedback node based on the output voltage signal, and the slope detector circuit is configured to detect the feedback voltage signal; and
    when a voltage of the feedback voltage signal drops sharply and a slope of the feedback voltage signal is larger than the slope threshold, the slope detector circuit is configured to output the transient enhanced signal.

3. The fast transient current mode control circuit of claim 2, wherein the power convertor further includes an error amplifier, a comparator and a current sensor circuit, two input terminals of the error amplifier are respectively connected to the feedback node and a reference voltage source, an output terminal of the error amplifier is grounded through a second capacitor, the second capacitor is connected in parallel with a series circuit of a third resistor and a third capacitor, a first comparison input terminal of the comparator is connected to an output terminal of the current sensor circuit, a second comparison input terminal of the comparator is connected to a non-grounded terminal of the second capacitor, and an output terminal of the comparator is connected to the switch controller circuit.

4. The fast transient current mode control circuit of claim 3, wherein the switch controller circuit includes a first NOR gate, a second NOR gate, a third NOR gate and a first NOT gate, an input terminal of the first NOR gate is connected to the output terminal of the comparator, two input terminals of the first NOR gate are respectively connected to the slope detector circuit and an output terminal of the first NOR gate, two input terminals of the second NOR gate are respectively connected to the output terminal of the first NOR gate and an output terminal of the third NOR gate, two input terminals of the third NOR gate are respectively connected to an output terminal of the second NOR gate and an output terminal of the oscillator circuit, and the output terminal of the second NOR gate is connected to the upper bridge switch.

5. The fast transient current mode control circuit of claim 3, further comprising:
    a buffer circuit including a buffer and a switching switch, a control terminal of the switching switch being connected to the slope detector circuit, a first buffer input terminal of the buffer being connected to the output terminal of the current sensor circuit, an output terminal of the buffer being connected to a second buffer input terminal of the buffer and a first terminal of the switching switch, and a second terminal of the switching switch being connected to a node between the third resister and the second capacitor.

6. The fast transient current mode control circuit of claim 1, wherein the oscillator circuit includes a constant current source, a capacitor, a comparator, an OR gate and an inverter, the constant current source is connected between a voltage source and a first terminal of the capacitor, a second terminal of the capacitor is grounded, two input terminals of the comparator are respectively connected to the first terminal of the capacitor and a reference voltage source, a second terminal of the capacitor is grounded, two input terminals of the OR gate are respectively connected to an output terminal of the comparator and an output terminal of the slope detector circuit, a set terminal of the inverter is connected to an output terminal of the OR gate, and an output terminal of the inverter is connected to the switch controller circuit.

7. The fast transient current mode control circuit of claim 6, wherein the oscillator circuit further includes a first NOT gate and a second NOT gate, the output terminal of the inverter is connected to an input terminal of the first NOT gate, an output terminal of the first NOT gate is connected to an input terminal of the second NOT gate, and an output terminal of the second NOT gate is connected to a reset terminal of the inverter.

8. A fast transient current mode control method, which is applicable for a power converter, the power converter including an upper bridge switch, a lower bridge switch, a storage inductor and a first capacitor, the upper bridge switch being connected to the lower bridge switch, one terminal of the storage inductor being connected to a node between the upper bridge switch and the lower bridge switch, the other terminal of the storage inductor being grounded through the first capacitor, the fast transient current mode control method comprising the following steps:

detecting an output voltage signal from the output terminal of the power converter between the storage inductor and the first capacitor by a slope detector circuit;

determining whether or not an output voltage of the output voltage signal drops sharply and a slope of the output voltage signal is larger than a slope threshold by the slope detector circuit, in response to determining that the output voltage of the output voltage signal does not drop sharply or the slope of the output voltage signal is not larger than the slope threshold, returning to the previous step;

in response to determining that the output voltage of the output voltage signal drops sharply and the slope of the output voltage signal is larger than the slope threshold, outputting a transient enhanced signal to enable an oscillator circuit to output a clock signal by the slope detector circuit, a rising edge of a pulse wave of the transient enhanced signal being aligned with a starting point from which the output voltage signal drops sharply, a falling edge of the pulse wave being aligned with a transition point from which the output voltage signal stops falling and begins to rise, and a rising edge of a pulse wave of the clock signal being aligned with the rising edge of the pulse wave of the transient enhanced signal; and triggering a switch controller circuit to output a switch control signal to the upper bridge switch to turn on the upper bridge switch during a duty cycle of the pulse wave according to the transient enhanced signal by the clock signal, such that an inductor current flowing through the storage inductor increases to be equal to a load current flowing through a load of a system connected to the output terminal of the power converter.

9. The fast transient current mode control method of claim 8, further comprising steps of:

generating a feedback voltage signal based on the output voltage signal from the output terminal of the power converter by a voltage driver circuit;

detecting the feedback voltage signal by the slope detector circuit; and determining whether or not a voltage of the feedback voltage signal drops sharply and a slope of the feedback voltage signal is larger than a slope threshold, in response to determining that the voltage of the feedback voltage signal does not drop sharply or the slope of the feedback voltage signal is not larger than the slope threshold, returning to the previous step in which the feedback voltage signal is generated, in response to determining that the voltage of the feedback voltage signal drops sharply and the slope of the feedback voltage signal is larger than the slope threshold, performing the step in which the slope detector circuit outputs the transient enhanced signal.

10. The fast transient current mode control method of claim 9, further comprising steps of:

outputting the transient enhanced signal to enable a buffer circuit by the slope detector circuit;

sensing the inductor current flowing through the storage inductor to output a current signal by a current sensor circuit;

receiving the current signal from the current sensor circuit by the buffer circuit such that a voltage of the buffer circuit reaches a target voltage; and increasing an error amplified signal outputted by an error amplifier of the power converter to be equal to the target voltage during the duty cycle of the pulse wave of the transient enhanced signal.

* * * * *